United States Patent
Neoh et al.

(10) Patent No.: US 6,235,437 B1
(45) Date of Patent: May 22, 2001

(54) MULTI-SEGMENT GLOBAL ALIGNMENT MARK

(75) Inventors: Soon Ee Neoh; Juan Boon Tan, both of Singapore (SG); Zadig Cheung-Ching Lam, Arcadia, CA (US); Kay Chai Ang, Taiping (MY)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 0 days.

(21) Appl. No.: 09/458,731

(22) Filed: Dec. 13, 1999

Related U.S. Application Data

(62) Division of application No. 09/157,674, filed on Sep. 21, 1998.

(51) Int. Cl.[7] .................................................. G03F 9/00
(52) U.S. Cl. ............................ 430/22; 438/975; 438/401
(58) Field of Search ............................... 430/22; 438/975, 438/401

(56) References Cited

U.S. PATENT DOCUMENTS

| | | | |
|---|---|---|---|
| 5,369,050 | * 11/1994 | Kawai | 437/62 |
| 5,401,691 | * 3/1995 | Caldwell | 437/228 |
| 5,496,777 | * 3/1996 | Moriyama | 437/249 |
| 5,627,624 | * 5/1997 | Yim et al. | 355/53 |
| 5,648,854 | * 7/1997 | McCoy et al. | 356/399 |
| 5,806,951 | * 9/1998 | Hashimoto | 430/22 |
| 6,022,649 | * 2/2000 | Neon et al. | 430/22 |

\* cited by examiner

Primary Examiner—Christopher G. Young
(74) Attorney, Agent, or Firm—George O. Saile; Rosemary L. S. Pike

(57) ABSTRACT

A multi-segment alignment mark useful for a variety of processes is described. The multi-segment alignment mark comprises a plurality of segments wherein each of the segments comprises a series of sub-segments wherein each of the sub-segments comprises a series of spaces and lines, each sub-segment having the same width but having a different number of spaces and lines within the width depending on the relative width of the spaces and lines. A wafer stepper detects signals from each of the sub-segments and uses the best signal to achieve alignment.

6 Claims, 3 Drawing Sheets

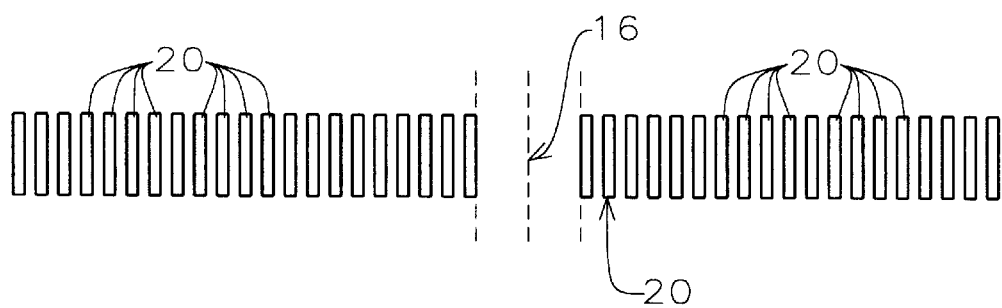
*FIG. 1*
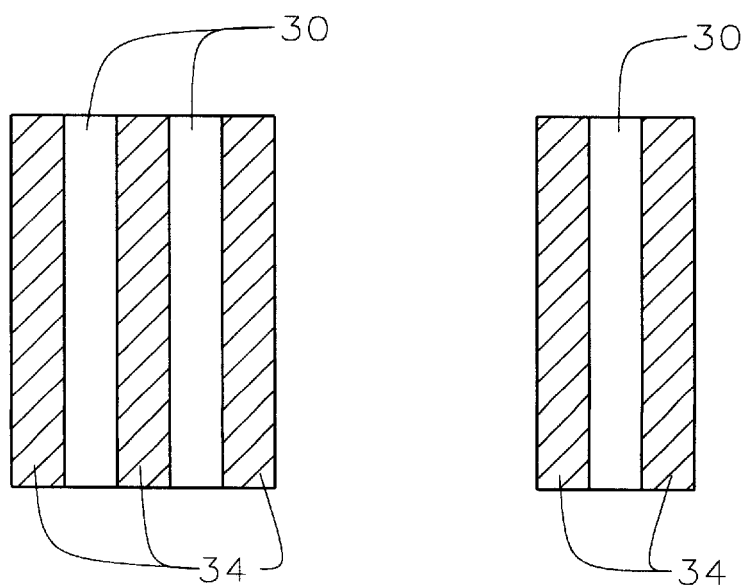
*FIG. 2 Proir Art*

MULTI-SEGMENT GLOBAL ALIGNMENT MARK

This is a division of patent application Ser. No. 09/157,674, filing date Sep. 21, 1998, Multi-Segment Global Alignment Mark, assigned to the same assignee as the present invention.

BACKGROUND OF THE INVENTION (1) Field of the Invention

The invention relates to the fabrication of integrated circuit devices, and more particularly, to a multi-segment alignment mark that can be used for a variety of lithography masking processes in the fabrication of integrated circuits.

(2) Description of the Prior Art

In the fabrication of integrated circuit devices, multiple layers of conductors and insulators are deposited and patterned to construct the integrated circuit. It is critical to align each subsequent layer with the previous layer with precision. This is typically accomplished by using alignment marks. A wafer stepper tool uses the alignment marks on a wafer as a reference point for adjusting a reticle over the wafer. The reticle contains the pattern to be generated within the layer. The reticle must be precisely aligned to the previous layer. A wafer stepper uses one of at least three methods to detect the alignment marks; these are light interference, bright field contrast, or dark field polarization effect.

For example, wafer alignment on an ASML stepper uses zero marks. For oxide chemical mechanical polishing (CMP) processes, zero marks are distorted at the metal layers due to oxide residue left on the marks. Target repairs at via layers are necessary to ensure that the zero marks are completely clean and can continue to be used. ASML's scribeline primary marks (SPM) have been developed to replace zero marks. The segmentation of the SPM marks determines signal strength and so is an important criteria for good alignment. For a foundry using this alignment scheme, different segmentations must be tested to find an optimized segmentation for each of the different processes. This testing requires laborious effort.

U.S. Pat. No. 5,627,624 to Yim et al shows a test reticle and alignment mark optimization method. U.S. Pat. No. 5,496,777 to Moriyama teaches forming alignment marks in enlarged portions of scribe lines. U.S. Pat. No. 5,401,691 to Caldwell discloses an inverse open frame alignment mark. U.S. Pat. No. 5,369,050 to Kawai discloses an alignment mark having a groove around it. U.S. Pat. No. 5,648,854 to McCoy et al discloses an alignment system using global alignment marks.

SUMMARY OF THE INVENTION

Accordingly, it is a principal object of the present invention to provide an effective and very manufacturable method of generating alignment marks in the manufacture of an integrated circuit device.

A further object of the invention is to provide a method of generating alignment marks useful for a variety of lithography processes.

A still further object is to provide a multi-segment alignment mark useful for a variety of lithography processes.

Another object of the invention is to provide a method of generating alignment marks useful for a variety of lithography processes by using a multi-segment alignment mark incorporating different segmentations into the size of a single mark.

Yet another object is to provide a multi-segment alignment mark incorporating different segmentations into the size of a single mark.

In accordance with the objects of this invention a multi-segment alignment mark useful for a variety of lithography processes is achieved. The multi-segment alignment mark comprises a plurality of segments wherein each of the segments comprises a series of sub-segments wherein each of the sub-segments comprises a series of spaces and lines, each sub-segment having the same width but having a different number of spaces and lines within the width depending on the relative width of the spaces and lines. A wafer stepper detects signals from each of the sub-segments and uses the best signal to achieve alignment.

BRIEF DESCRIPTION OF THE DRAWINGS

In the accompanying drawings forming a material part of this description, there is shown:

FIG. 1 schematically illustrates a top view of a multi-segment alignment mark of the present invention.

FIG. 2 schematically illustrates a top view of alignment mark segments of the prior art.

DESCRIPTION OF THE PREFERRED EMBODIMENTS

Figure 3:
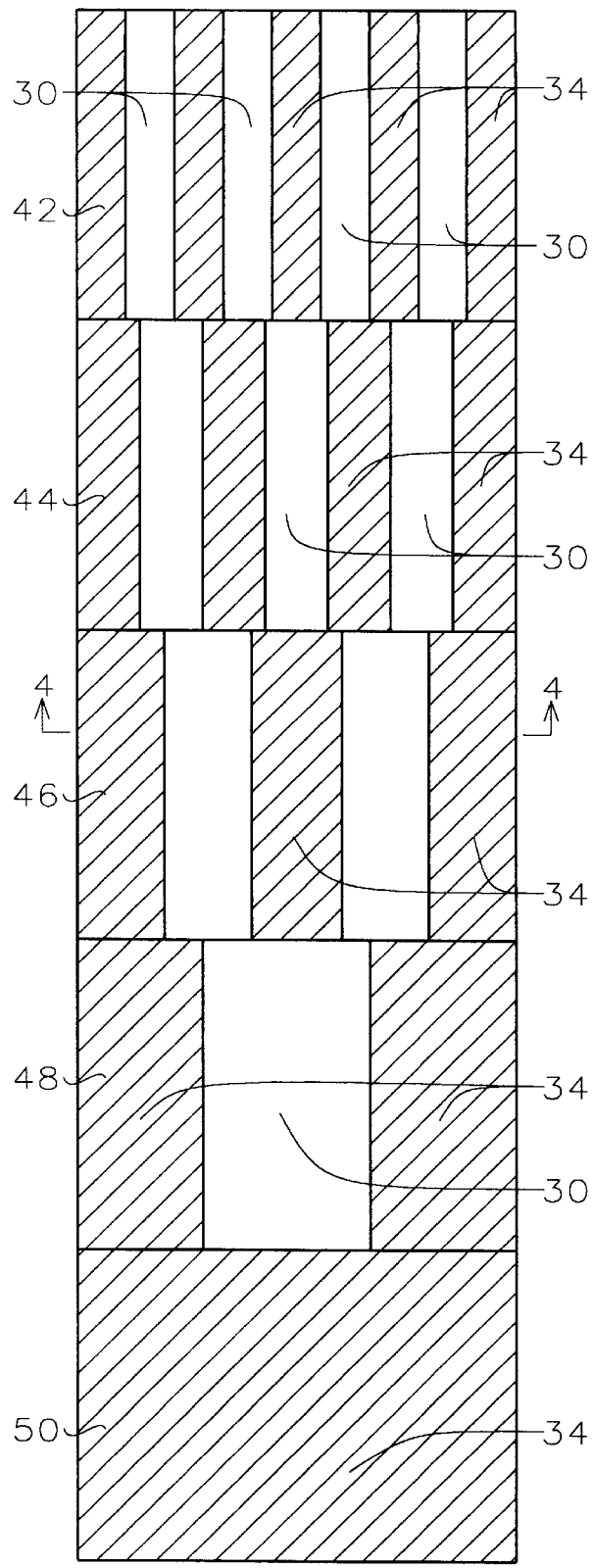
FIG. 3 schematically illustrates a top view of one segment of the multi-segment alignment mark of the present invention.

The present invention is a multi-segment alignment mark which incorporates different segmentations into the size of a single mark. This is suitable for the foundry industry because many different lithography processes may need a different mark type. The multi-segment mark of the present invention contains these different segmentations for different lithography processes.

The multi-segment mark allows the wafer stepper to pick up the best signal from a broad spectrum of segmentations. Thus, it is more capable of tolerating process variations than conventional segmented alignment marks. The robustness in design of the multi-segment mark of the present invention will reduce the probability of misalignment.

Using the multi-segment mark of the present invention also saves space on the reticle because the scribe line no longer needs a different segmentation mark. In the prior art, many different alignment mark types are printed on a layer for backup purposes in case the primary segmented mark fails. This is especially true in the development phase as there is a range of process conditions and many alignment mark must be printed for the purpose of aligning the subsequent layer. The multi-segment mark of the present invention eliminates the need for printing many different mark types, thus saving space allocation for alignment purposes.

Referring now more particularly to FIG. 1, there is shown a top view illustration of a multi-segment global alignment mark 10 of the present invention. The alignment mark is made up of segments 20. Visual cross hairs at 16 at the center of the alignment mark are used as a reference to align the reticle to form the alignment mark. It should be understood that the multi-segment alignment mark illustrated in FIG. 1 is an example only. Many different combinations of lines and spaces may comprise the alignment mark of the present invention.

As illustrated by way of example in FIG. 1, each segment 20 is typically 7.0 microns wide and 90 microns long. FIG. 2 illustrates typical alignment mark segments of the prior art. Chrome areas 34 alternate with clear areas 30.

FIG. 3 is a magnification of a single segment 20 of the multi-segment global alignment mark of the present invention. The single segment is in turn segmented. For example, it may be segmented as shown in FIG. 3. Segment 42 has lines 34 of width 1.0 $\mu$ and spaces 30 of width 0.6 $\mu$. Segment 44 has lines 34 of width 1.4 $\mu$ and spaces 30 of width 0.7 $\mu$. Segment 46 has lines 34 of width 2.2 $\mu$ and spaces 30 of width 1.6 $\mu$. Segment 48 has lines 34 of width 3.0 $\mu$ and a space 30 of width 2.0 $\mu$. Segment 50 has a line 34 of width 7.0 $\mu$. That is, the reticle segment 20 has chrome lines 34 and clear spaces 30.

Figure 4:
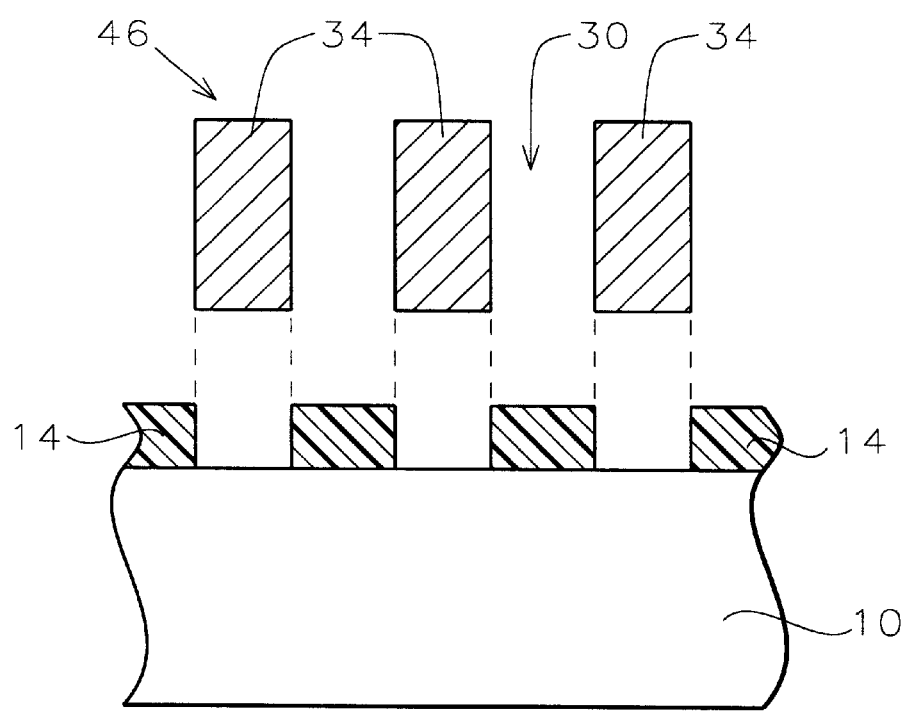
FIG. 4 schematically illustrates in cross-sectional representation the use of view 4—4 of the alignment mark segment illustrated in FIG. 3.

FIG. 4 illustrates the cross-section of a substrate 10. The substrate may comprise any film including metal, oxide, polysilicon, and so on. A resist layer 14 has been coated over the film 10 to be patterned. For example, segment 46 of the multi-segment alignment mark 20 has been chosen to pattern the film 10. The resist 14 underlying the chrome lines 34 will be etched away while the resist underlying the spaces 30 will remain, resulting in the resist pattern illustrated in FIG. 4.

A single segment of the global alignment mark of the present invention may be segmented further in a variety of designs, including, but not limited to the design illustrated in FIG. 3. Each segment 20 may be identically segmented within an alignment mark. However, it is possible that each segment 20 may be segmented differently. Any number of sub-segments from 2 to 5 or more may be implemented in each segment 20.

The process of the invention provides a very manufacturable method of generating alignment marks that can be used in a variety of lithography processes. The multi-segment global alignment mark of the present invention allows the stepper to pick up the best signal from a broad spectrum of segmentation.

The process of the present invention can be used with steppers using any one of the three methods to detect alignment marks: light interference, bright field contrast, or dark field polarization effect.

While the invention has been particularly shown and described with reference to the preferred embodiments thereof, it will be understood by those skilled in the art that various changes in form and details may be made without departing from the spirit and scope of the invention.

What is claimed is:

1. A multi-segment global alignment mark comprising:

a plurality of segments wherein each of said segments comprises a series of sub-segments wherein each of said sub-segments comprises a series of spaces and lines each sub-segment having the same width but having a different number of spaces and lines within said width depending on the relative width of said spaces and lines.

2. The multi-segment alignment mark according to claim 1 wherein a wafer stepper is used to align a reticle using said multi-segment alignment mark wherein said wafer stepper detects a signal from each of said sub-segments and uses the best said signal to align said reticle.

3. The multi-segment alignment mark according to claim 1 wherein each of said segments has an identical series of sub-segments.

4. The multi-segment alignment mark according to claim 1 wherein each of said segments has a different series of sub-segments.

5. The multi-segment alignment mark according to claim 1 wherein said multi-segment alignment mark is formed on a scribe line.

6. The multi-segment alignment mark according to claim 1 wherein each of said lines comprises chrome.

* * * * *